(12) United States Patent
Luchinin et al.

(10) Patent No.: US 9,492,841 B2
(45) Date of Patent: Nov. 15, 2016

(54) METHOD FOR PORE SEALING OF POROUS MATERIALS USING POLYIMIDE LANGMUIR-BLODGETT FILM

(71) Applicants: IMEC, Leuven (BE); St. Petersburg Electrotechnical University, St. Petersburg (RU)

(72) Inventors: Victor Luchinin, St. Petersburg (RU); Svetlana Goloudina, St. Petersburg (RU); Vyacheslav Pasyuta, St. Petersburg (RU); Alexey Ivanov, St. Petersburg (RU); Mikhail Baklanov, Veltem-Beisem (BE); Mikhail Krishtab, St. Petersburg (RU)

(73) Assignees: IMEC, Leuven (BE); St. Petersburg Electrotechnical University, St. Petersburg (RU)

( * ) Notice: Subject to any disclaimer, the term of this patent is extended or adjusted under 35 U.S.C. 154(b) by 202 days.

(21) Appl. No.: 13/847,457

(22) Filed: Mar. 19, 2013

(65) Prior Publication Data
US 2013/0251978 A1 Sep. 26, 2013

Related U.S. Application Data

(60) Provisional application No. 61/613,295, filed on Mar. 20, 2012.

(51) Int. Cl.
*B05D 1/20* (2006.01)
*B32B 37/15* (2006.01)
*B32B 18/00* (2006.01)
*B32B 27/04* (2006.01)
*B32B 27/28* (2006.01)
*H05K 1/03* (2006.01)
*H01L 21/02* (2006.01)
*H05K 3/14* (2006.01)
*C09D 179/08* (2006.01)
*C08G 73/10* (2006.01)

(52) U.S. Cl.
CPC .............. *B05D 1/208* (2013.01); *B32B 18/00* (2013.01); *B32B 27/04* (2013.01); *B32B 27/281* (2013.01); *B32B 37/15* (2013.01); *C08G 73/1067* (2013.01); *C09D 179/08* (2013.01); *H01L 21/02285* (2013.01); *H01L 21/02318* (2013.01); *H05K 1/03* (2013.01); *H05K 3/143* (2013.01); *B05D 1/20* (2013.01); *B32B 2260/046* (2013.01); *B32B 2305/07* (2013.01); *B32B 2307/00* (2013.01); *B32B 2307/204* (2013.01); *B32B 2379/08* (2013.01); *B32B 2457/00* (2013.01); *H05K 2201/01* (2013.01); *H05K 2201/0104* (2013.01); *H05K 2201/0116* (2013.01); *H05K 2201/0154* (2013.01); *H05K 2201/0162* (2013.01); *Y10T 428/249979* (2015.04); *Y10T 428/249991* (2015.04)

(58) Field of Classification Search
None
See application file for complete search history.

(56) References Cited

U.S. PATENT DOCUMENTS

| | | | | |
|---|---|---|---|---|
| 4,822,853 A * | 4/1989 | Uekita | ................... | C08G 73/10 428/473.5 |
| 5,190,591 A | 3/1993 | Okano et al. | | |
| 5,705,232 A * | 1/1998 | Hwang | ................... | B05D 1/005 257/E21.259 |
| 2005/0064322 A1* | 3/2005 | Babich | ................... | G03F 7/075 430/270.1 |
| 2005/0095828 A1 | 5/2005 | Schmidt et al. | | |
| 2006/0108320 A1 | 5/2006 | Lazovsky et al. | | |
| 2007/0278682 A1 | 12/2007 | Ko et al. | | |
| 2008/0064214 A1 | 3/2008 | Han et al. | | |

FOREIGN PATENT DOCUMENTS

DE 100 14 587 A1 10/2001

OTHER PUBLICATIONS

Goloudina, S.I., et al., "Pore sealing of SiOCH ultra low-k dielectrics with polyimide Langmuir-Blodgett film," Mater. Res. Soc. Symp. Proc. vol. 1428, Copyright 2012 Materials Research Society, 6 pages.*
Chapelon et al., "Characterization and integration of a CVD porous SIOCH (k<2.5) with enhanced mechanical properties for 65 nm CMOS interconnects and below," Microelectonic Engineering 76 (2004) 1-7.*
Min et al., "Functionalized mesoporous silica/polyimide nanocomposite thin films with improved mechanical properties and low dielectric constant," Composites Science and Technology 68 (2008) 1570-1578 (Oct. 22, 2007).*
Volksen et al., "Low Dielectric Constant Materials," Chem. Rev. 2010, 110, 56-110 (Dec. 4, 2009).*
Materials Research Society, "Program—Symposium C: Interconnect Challenges fro CMOS Technology—Materials, Processes, and Reliability for Downscaling, Packaging, and 3D Stacking", 2012 MRS Spring Meeting & Exhibit, Apr. 9-13, 2012, available via the Internet at www.mrs.org/s12-program-c/ (last visited Jul. 1, 2015).
B. R. Murthy et al., "Self-Assembled Monolayers as Cu Diffusion Baniers for Ultralow-k Dielectrics", Electrochemical and Solid-State Letters, 9 (7) F61-F63 (2006) (May 8, 2006).

* cited by examiner

*Primary Examiner* — William Phillip Fletcher, III
(74) *Attorney, Agent, or Firm* — McDonnell Boehnen Hulbert & Berghoff LLP

(57) ABSTRACT

Method for pore sealing a porous substrate, comprising: forming a continuous monolayer of a polyimide precursor on a liquid surface, transferring said polyimide precursor monolayer onto the porous substrate with the Langmuir-Blodgett technique, and imidization of the transferred polyimide precursor monolayers, thereby forming a polyimide sealing layer on the porous substrate. Porous substrate having at least one surface on which a sealing layer is provided to seal pores of the substrate, wherein the sealing layer is a polyimide having a thickness of a few monolayers and wherein there is no penetration of the polyimide into the pores.

9 Claims, 5 Drawing Sheets

METHOD FOR PORE SEALING OF POROUS MATERIALS USING POLYIMIDE LANGMUIR-BLODGETT FILM

CROSS-REFERENCE TO RELATED APPLICATIONS

This application claims priority to U.S. Patent App. No. 61/613,295, entitled "Method for Pore Sealing of Porous Materials Using Polyimide Langmuir-Blodgett Film", filed on Mar. 20, 2012, the contents of which are fully incorporated by referenced herein for all purposes.

TECHNICAL FIELD

The present disclosure relates to methods for pore sealing of porous materials. The present disclosure further relates to pore sealed porous materials.

BACKGROUND OF THE DISCLOSURE

Continual decreasing of feature size of transistors in modern integrated circuits constrains thickness of auxiliary dielectric layers such as barrier layers or etch-stop layers in interconnects because of their relatively high dielectric constant reducing efficiency of low-κ material integration. For example, dielectric materials used today as barrier or etch-stop layers are usually silicon nitride (SiN, κ value of about 7.0) and silicon-carbonitride (SiCN, κ value of about 4.8), dielectric constants which noticeably exceed that of advanced ultra low-κ materials (κ lower than 2.1).

In general, a low-κ dielectric is a material with a small dielectric constant relative to silicon dioxide. Further an ultra-low κ dielectric material is characterized by dielectric constant κ lower than 2.3, more preferably lower than 2.1. Usually the pore size of such a material is between 1 and 5 nm.

Deposition of a thin layer on a porous material without penetrating the pores is often nontrivial and represents a difficult task especially for chemical vapor deposition (CVD) and atomic layer deposition (ALD) techniques which are both using gaseous precursors which can diffuse inside the net of pores thus increasing the effective thickness of the top layer and deteriorating properties of pristine material.

SUMMARY OF THE DISCLOSURE

It is an aim of this disclosure to present a method for pore sealing a porous substrate which does not show the drawbacks of the prior art discussed above.

This aim is achieved by the method comprising the steps of the first independent claim.

It is another aim of this disclosure to present a pore sealed porous substrate with improved surface characteristics.

This other aim is achieved by the substrate comprising the technical characteristics of the second independent claim.

According to this disclosure, the drawbacks of the prior art are alleviated by constructing, by means of the Langmuir-Blodgett technique, a polyimide sealing film on the surface of the porous substrate. The resulting sealing film comprises one or more continuous monolayers consisting of close packed polymer chains.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF ILLUSTRATIVE EMBODIMENTS

Figure 1A:
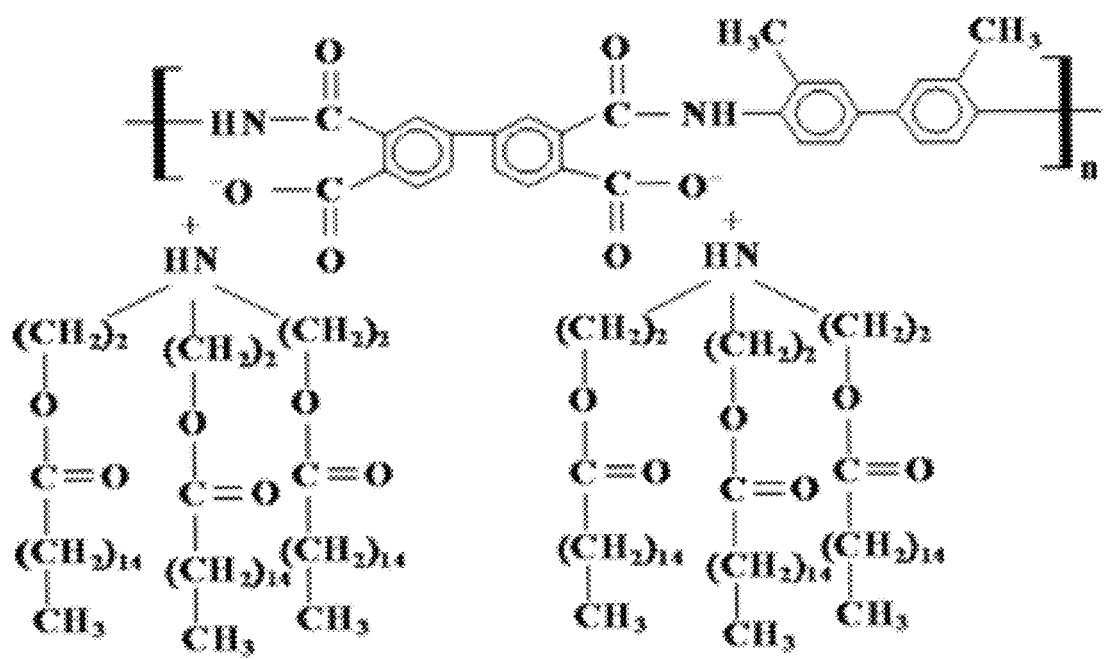
FIG. 1A represents the structural formula of polyimide prepolymer—polyamic acid alkylamine salt.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

The present disclosure relates to a method for pore sealing of a porous substrate using films of rigid-chain polyimide deposited by Langmuir-Blodgett technique, herein referred to as LB-films. The method is suitable for pore sealing applications of porous materials such as ultra-low-κ dielectric materials which are used in interconnect applications of advanced integrated circuits.

Further the present disclosure also relates to the sealing layer obtained by the method of the disclosure which comprises a rigid-chain polyimide and has a dielectric constant (κ-value) of about 3.2-3.3.

In general, a low-κ dielectric is a material with a small dielectric constant relative to silicon dioxide. Further an ultra-low κ dielectric material is characterized by dielectric constant κ lower than 2.3, more preferably lower than 2.1. Usually the pore size of such a material is between 1 and 5 nm.

Deposition of a thin layer on a porous material without penetrating the pores is often nontrivial and represents a difficult task especially for chemical vapor deposition (CVD) and atomic layer deposition (ALD) techniques which are both using gaseous precursors which can diffuse inside the net of pores thus increasing the effective thickness of the top layer and deteriorating properties of pristine material. The method of the disclosure solves this problem by using LB films which are deposited on the surface of a porous material such as for example SiOCH as one or more continuous monolayers of strongly interacting macromolecules and which subsequently form close packed polymer chains in the polyimide film.

A Langmuir-Blodgett (LB) film contains one or more monolayers of an organic material, deposited from the surface of a liquid onto a solid by immersing (or emersing) the solid substrate into (or from) the liquid. A monolayer is adsorbed homogeneously with each immersion or emersion step, thus films with very accurate thickness can be formed. This thickness is accurate because the thickness of each monolayer is known and can therefore be added to find the total thickness of a Langmuir-Blodgett film. The monolayers are assembled vertically and are usually composed of amphiphilic molecules with a hydrophilic head and a hydrophobic tail.

Figure 1B:
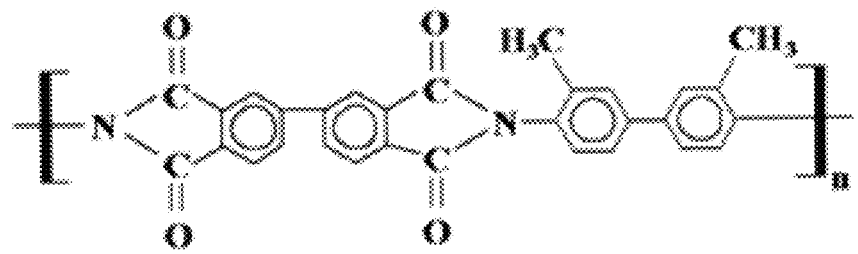
FIG. 1B represents the structural formula of polyimide prepolymer—polyimide (PI).

Polyimide (abbreviated PI) is a polymer of imide monomers. In embodiments of the disclosure the polyimide film was obtained by thermal imidization (e.g. at a temperature within the range of 250-400° C.) of Langmuir-Blodgett films of precursor alkylammonium salts of polyamic acid (PAA) based on dianhydride of 3,3',4,4'-biphenyltetracarboxylic acid and o-tolidine (BPDA-oTD) and tert-amine o, o', o"-trihexadecanoyltriethanolamine as illustrated in FIG. 1. Other polyimide precursors, known to the person skilled in the art, may however also be used.

Advantageously the thickness of the polyimide film deposited by the Langmuir-Blodgett technique can be made as thin as several monolayers. Moreover, intermolecular interaction of precursor macromolecules densely packed within a monolayer before transfer on the porous substrate makes it possible to avoid penetration of precursor material inside the pores. The latter peculiarity of the deposition process may also lead to achievement of a pore sealing effect with about 4 nm of PI film in one of the specific embodiments.

The polyamic acid alkylamine salt (PAAS) was synthesized in two steps. Initially, individual solutions of polyamic acid and tertiary amine with a concentration of 1 mmol/l were prepared in a 1:1 DMA-benzene solvent mixture. Then these solutions were mixed in a ratio of 1:2 immediately before using it for preparation of the PAAS monolayer on the surface of deionized water filling the LB trough. The PAAS solution was disposed dropwise onto the water surface at 5-10 min intervals for 1 h. A surface pressure as a function of an area related to a repeating unit of polymer chains on the water surface (a compression isotherm) evidenced formation of close packed polymer chains in the monolayer. After controlled formation the PAAS monolayer was subsequently transferred onto the porous substrate.

Prepared monolayers of PAAS were transferred onto the layer of porous SiOCH material having a κ-value of 2.3. The pore structure of the pristine material was evaluated with ellipsometric porosimetry and found to have an open porosity of about 30% and a pore size of about 2 nm. The method of the disclosure is suitable to seal porous dielectrics having a pore size of 1 to 5 nm, without any penetration of the sealing material into the pores.

Formation of PI films was accomplished at different conditions of PAAS LB films deposition such as surface pressure and the number of layers in LB film. Monolayers of PAAS on the water-air interface were formed at a surface pressure ($\pi_{dep}$) of 25, 30 and 35 mN/m, respectively, and then underwent a transfer procedure repeated 8 or 20 times. The rate of immersion and withdrawal of the substrate was kept constant at 0.2 cm/min for all the experiments. The transport coefficient was used to control the quality of transferred monolayer and was calculated as a ratio between the area of monolayer decreased in the course of deposition and the area of the substrate used. This coefficient was close to 1.0 when the surface pressure of monolayer was fixed at 25 and 30 mN/m, while the value of 1.1 was obtained at a surface pressure of 35 mN/m.

The imidization step (thermal treatment) of the PAAS LB film was carried out after the transfer of the LB film on the substrate comprising the porous material at two temperatures of 250° C. and 400° C. The imidization took place in vacuum at a pressure lower than $10^{-1}$ Torr, preferably about $10^{-3}$ Torr, or in inert atmosphere such as $N_2$ or noble gases to prevent oxidation. The duration of the imidization process is from about 1 hour to several hours. In the preferred embodiments the duration was 4 to 6 hours.

The sealing film was examined in terms of thickness and refractive index, roughness and impermeability of polyimide layer to external chemicals such as toluene.

The thickness and refractive indices of the sealing LB films were determined by reflection ellipsometry within the framework of one-layer optical model. The surface morphology was inspected with an atomic force microscope Nanoscope V in a tapping mode in air. Ellipsometric porosimetry was used to test integrity of the sealing LB film. The latter technique is based on in-situ recording of ellipsometric angles during increase of toluene vapor pressure in the chamber. Then the values of angles at certain pressure are recalculated into values of refractive index by using of one-layer model, thus forming adsorption and desorption curves which are to be analyzed. Such a measurement was performed with EP-10 equipped with spectroscopic ellipsometer 801SE ($\lambda$=350-850 nm). In addition cross-section of samples was made with Helios NanoLab 400 combining ion and electron beams.

Figure 2A:
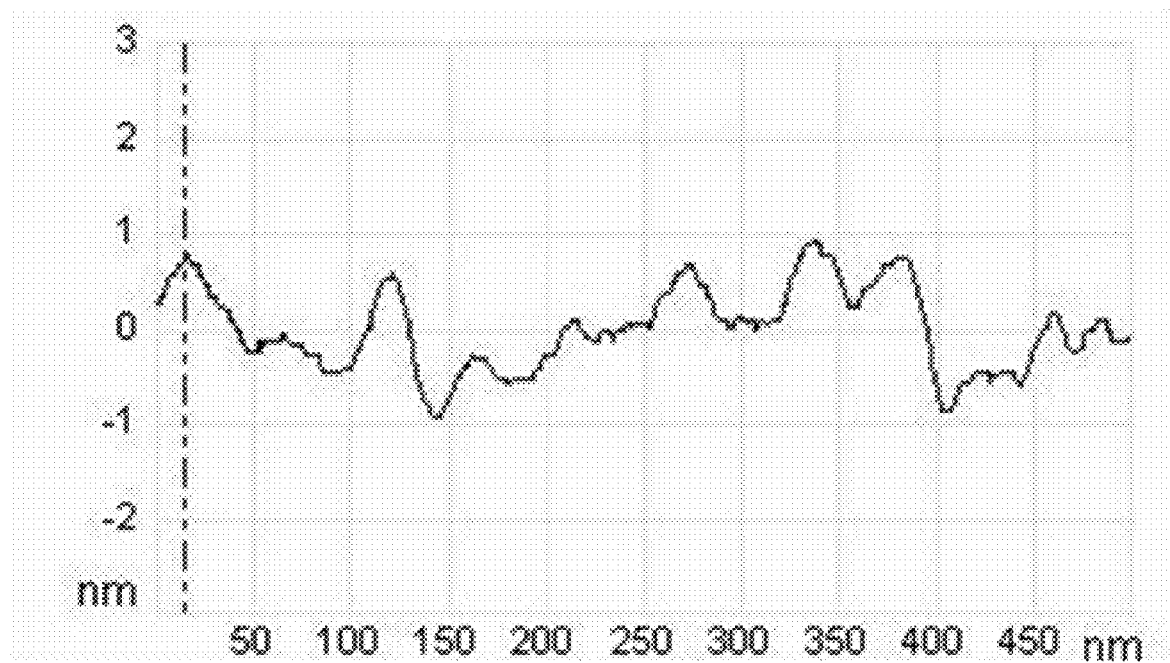
FIG. 2A represents the AFM-profile of pristine SiOCH.
Figure 2B:
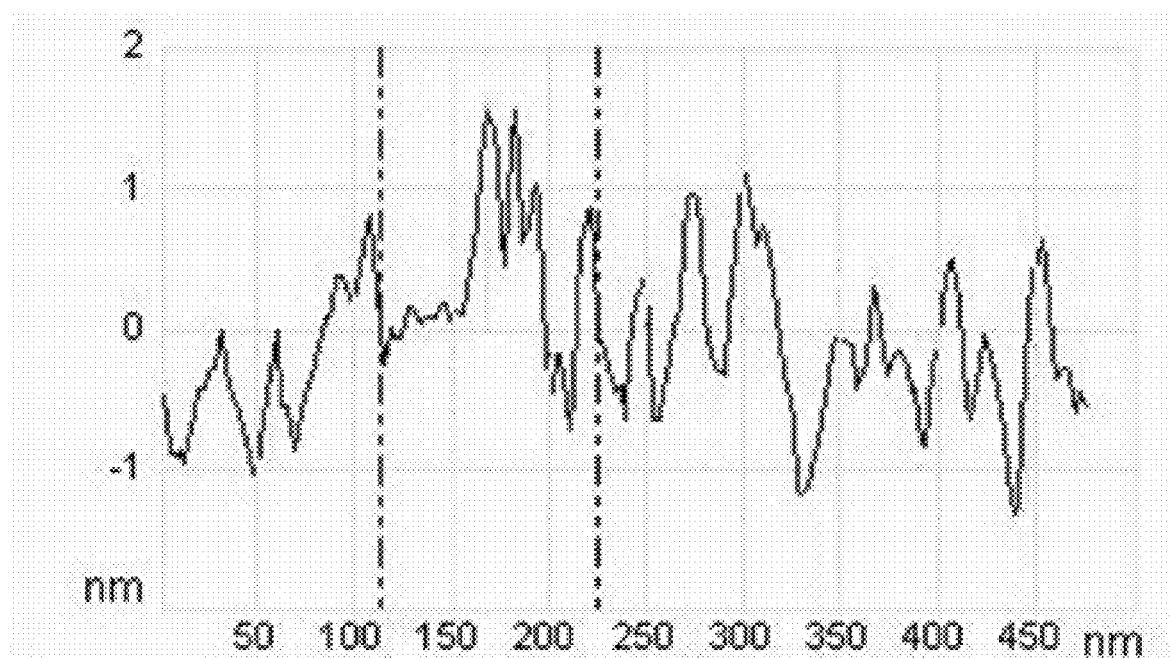
FIG. 2B represents the AFM-profile of pristine SiOCH after deposition of PI film.

Initially, the measurement techniques mentioned above were applied to pristine samples composed of a thin layer of SiOCH low-κ dielectric on silicon substrate. Surface analysis with AFM demonstrates a profile with peak-to-peak value of about 2 nm as shown in FIG. 2A which is a measure of the pore openings. According to ellipsometric measurement the thickness of the low-κ layer is equal to 193 nm and refractive index is close to 1.33. As a supplementary layer, the sealing polyimide film on top of the porous low-κ material is designed to minimize a rise of the κ-value of the whole structure comprising the low-κ material with the sealing layer on top.

Results of the ellipsometric evaluation of SiOCH samples covered with LB polyimide film (sealing layer) at different conditions are presented in the Tables 1 and 2 below. As can be seen from these data, refractive index of the 2-layer structure deviates from the pristine one by less than 2% regardless of number of PI layers and parameters of film formation.

The thickness of the polyimide film can be estimated as an increase of the initial thickness of SiOCH layer. The lower temperature of the imidization step leads to the higher values of effective film thickness which relates to the processes of removal of aliphatic segments in the PAAS molecule and ordering of polymer chains constituting the film.

Thickness (d) and refractive index (n) of SiOCH/PI structure with polyimide film formed at $T_a=250°$ C. are shown in Table 1 below.

TABLE 1

| $\pi_{dep}$, mN/m | N | d, nm | (d − $d_i$), nm |
|---|---|---|---|
| 8 PI layers | | | |
| 25 | 1.33 | 200 | 7 |
| 30 | 1.34 | 200 | 7 |
| 35 | 1.35 | 201 | 8 |
| 20 PI layers | | | |
| 25 | 1.35 | 208 | 15 |
| 30 | 1.36 | 212 | 19 |
| 35 | 1.36 | 214 | 21 |

Thickness (d) and refractive index (n) of SiOCH/PI structure with polyimide film formed at $T_a=400°$ C. are shown in Table 2 below.

TABLE 2

| π, mN/m | N | d, nm | (d − di), nm |
|---|---|---|---|
| 8 PI layers | | | |
| 25 | 1.35 | 197 | 4 |
| 30 | 1.34 | 196 | 3 |
| 35 | 1.34 | 197 | 4 |
| 20 PI layers | | | |
| 25 | 1.33 | 202 | 9 |
| 30 | 1.34 | 203 | 10 |
| 35 | 1.33 | 204 | 11 |

Figure 3B:
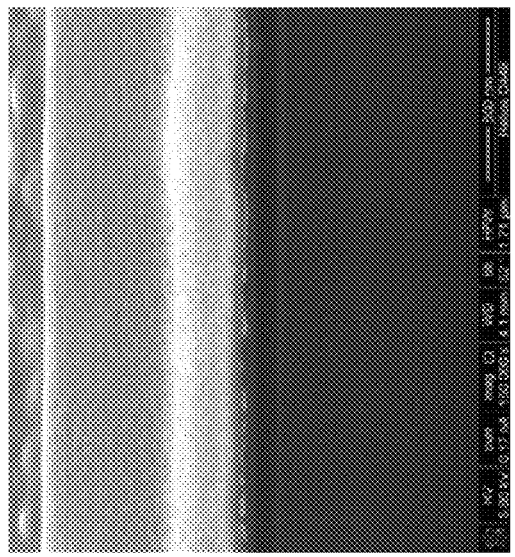
FIG. 3B represents the Scanning Electron Microscopy (SEM) images of cross-sections of a Si/SiOCH/PI structure wherein the imidization temperature is 250° C. All samples are covered with a Pt layer.
Figure 3C:
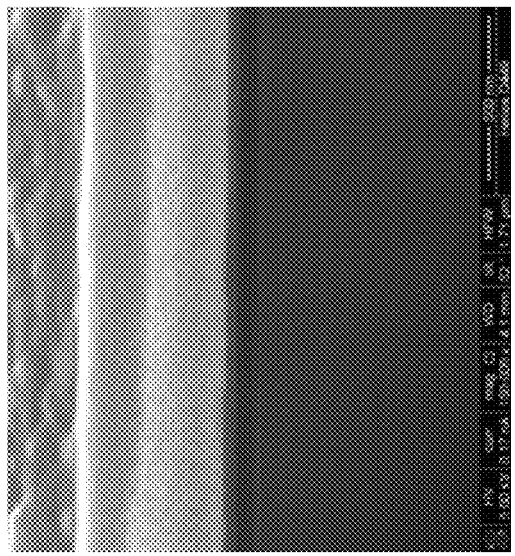
FIG. 3C represents the Scanning Electron Microscopy (SEM) images of cross-sections of a Si/SiOCH/PI structure wherein the imidization temperature is 400° C. All samples are covered with a Pt layer.
Figure 3A:
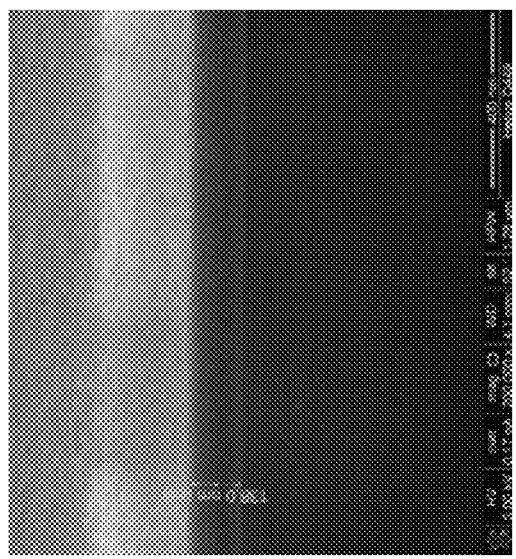
FIG. 3A represents the Scanning Electron Microscopy (SEM) images of cross-sections of a Si/SiOCH structure. All samples are covered with a Pt layer.

Based on the analysis of AFM-images and profiles made after deposition of PI film one can conclude that the roughness of the sealed porous material is influenced by the surface pressure within PAAS monolayer on the water-air interface, the number of PI layers and the imidization temperature. The smallest peak-to-peak value of about 3 nm (as shown in FIGS. 3A-3C) was observed on the sample with 8 PI layers formed at a surface pressure of 25 mN/m which were annealed at 400° C.

The surface of sealed porous material became rougher than pristine one. However, further smoothing of LB films can be achieved by changing the deposition conditions such as lowering the rate of PAAS monolayer transfer or by using a PI precursor selected to lead to an increased density of the LB film before the transfer to the substrate.

Without wishing to be bound by theory it is believed that the intermolecular interaction in the continuous PAAS monolayer allows transferring a continuous monolayer instead of separate molecules which results in an effective pore sealing preventing the PI film (sealing layer) or parts thereof from going inside the pores. Visual proof of the latter effect is presented in FIG. 3B and FIG. 3C which show cross-section SEM-images of two structures with top layers deposited by LB technique and different imidization temperatures of 250° C. and, respectively, 400° C. The measure of sealant pores penetration can be estimated visually through the contrast in the SEM-image at the interface between the layer of low-κ material (SiOCH) and the top PI film. The interface between PI and SiOCH layer is in both cases sharp and proves the absence of pores penetration.

Figure 4:
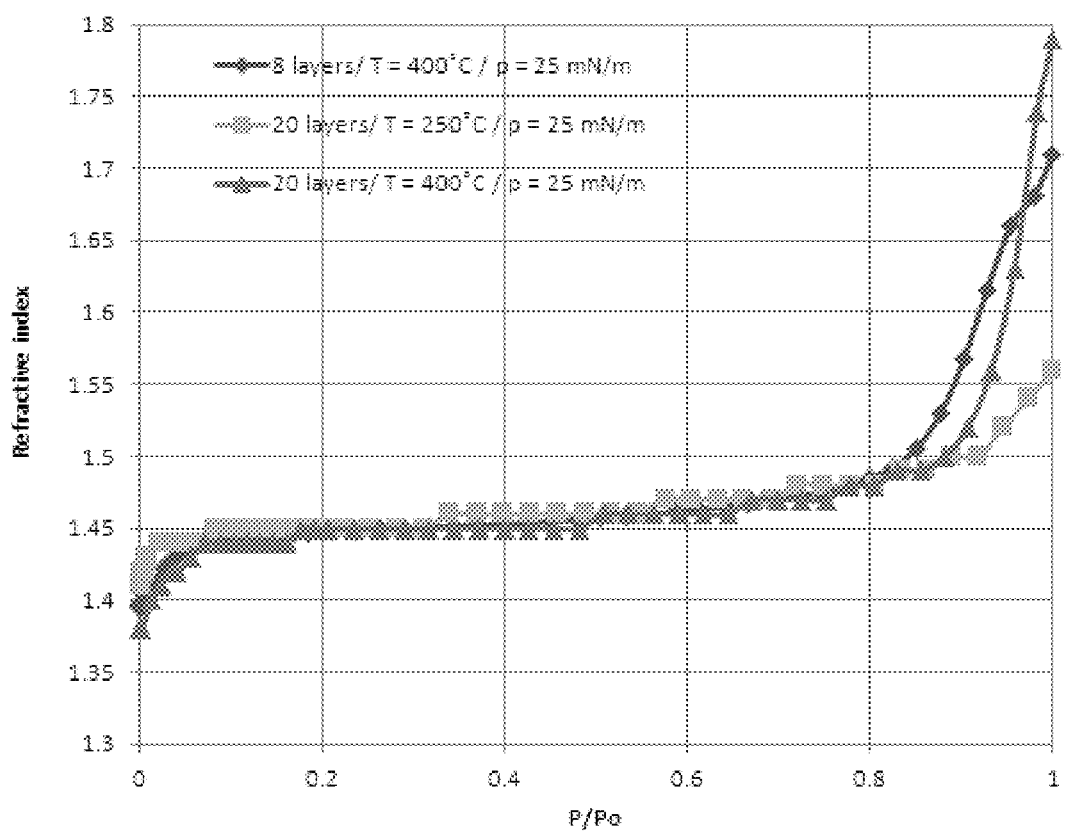
FIG. 4 shows the adsorption isotherms for Si/SiOCH/PI structures differentiated by conditions of PI film formation.
Figure 5:
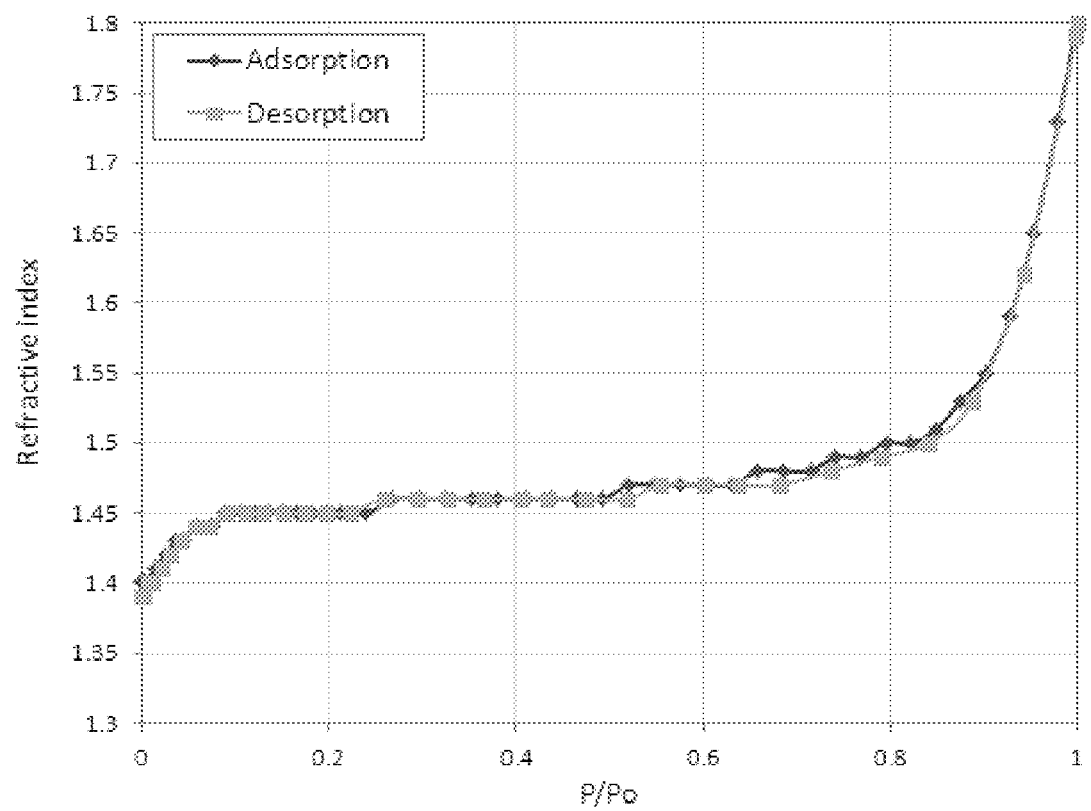
FIG. 5 shows the adsorption and desorption isotherms for Si/SiOCH/PI structure.

Analysis of toluene adsorption and desorption isotherms obtained from ellipsometric porosimetry (as shown in FIGS. 4 and 5) proves the efficiency of pore sealing with PI films of the disclosure. All tested samples show isotherms similar to that in FIG. 5. According to these data the refractive index of the two-layer structure SiOCH/PI is almost constant within a broad range of toluene pressure which suggests that pores of low-κ material are still filled with air which means that the surface pores are sealed. However there are two small areas namely at low and high pressures of adsorbate where the refractive index changes. We believe that an initial insignificant rise of refractive index is related to the intrinsic microporosity of polyimide film which is caused by its domain structure. The fact of abrupt increase in the end of the adsorption process may be a consequence of toluene condensation on the PI film surface owing to its roughness which is confirmed with an absence of any hysteresis loop in that region of pressures.

In a specific embodiment it was found that films of about 4 nm comprising 8 polyimide monolayers are able to seal the surface of porous material with average pore size of 2 nm without significant deterioration of its pristine properties. The thickness and the number of monolayers may vary upon changing the experimental conditions.

In various embodiments of the disclosure an effective pore sealing is obtained with a thickness lower than 5 nm of sealant due to intermolecular forces between polymer chains in precursor monolayer which allows transferring a continuous monolayer instead of separate molecules.

The invention claimed is:

1. A method for pore sealing a porous substrate, comprising:
   (a) forming a continuous monolayer of a polyimide precursor on a liquid surface; and
   (b) transferring said polyimide precursor monolayer onto the porous substrate with the Langmuir-Blodgett technique, wherein the porous substrate is an ultra-low κ dielectric material having a dielectric constant κ lower than 2.3 and the porous substrate has a pore size of 1 to 5 nm;
   and further comprising:
   (c) imidization of the transferred polyimide precursor monolayers, thereby forming a polyimide sealing layer on the porous substrate.

2. The method according to claim 1, wherein both forming said continuous monolayer of said polyimide precursor on the liquid surface and transferring said polyimide precursor monolayer onto the porous substrate with said Langmuir-Blodgett technique are repeated a number of times, so that said sealing layer on said porous substrate comprises a plurality of said monolayers.

3. The method according to claim 2, wherein said sealing layer has a thickness lower than 5 nm.

4. The method according to claim 1, wherein the polyimide precursor is polyamic acid alkylamine salt.

5. The method according to claim 1, wherein the sealing layer does not penetrate into pores of the porous substrate.

6. The method according to claim 1, wherein the dielectric constant $\kappa$ is lower than 2.1.

7. The method according to claim 1, wherein the porous substrate has an average pore size of 2 nm.

8. The method according to claim 1, wherein the porous substrate is a porous organosilicate.

9. The method according to claim 8, wherein the porous organosilicate comprises SiOCH material having a $\kappa$-value of 2.3 and an average pore size of 2 nm.

* * * * *